(12) United States Patent
Sato

(10) Patent No.: US 10,361,533 B2
(45) Date of Patent: Jul. 23, 2019

(54) OPTICAL MODULE IMPLEMENTING LASER DIODES

(71) Applicant: Sumitomo Electric Industries, Ltd., Osaka-shi (JP)

(72) Inventor: Shunsuke Sato, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/059,717

(22) Filed: Aug. 9, 2018

(65) Prior Publication Data

US 2019/0052049 A1 Feb. 14, 2019

(30) Foreign Application Priority Data

Aug. 10, 2017 (JP) ................. 2017-155545

(51) Int. Cl.
| | |
|---|---|
| *H01S 5/022* | (2006.01) |
| *H01S 5/40* | (2006.01) |
| *G02B 6/42* | (2006.01) |
| *H01S 5/00* | (2006.01) |
| *H01S 5/024* | (2006.01) |

(52) U.S. Cl.
CPC ........ *H01S 5/02252* (2013.01); *G02B 6/4201* (2013.01); *H01S 5/0228* (2013.01); *H01S 5/02216* (2013.01); *H01S 5/02272* (2013.01); *H01S 5/02276* (2013.01); *H01S 5/4012* (2013.01); *H01S 5/005* (2013.01); *H01S 5/02248* (2013.01); *H01S 5/02284* (2013.01); *H01S 5/02415* (2013.01); *H01S 5/02438* (2013.01); *H01S 5/02476* (2013.01)

(58) Field of Classification Search
CPC ............. H01S 5/02252; H01S 5/02276; H01S 5/02216; H01S 5/4012; H01S 5/02272; H01S 5/0228; H01S 5/02476; H01S 5/02438; H01S 5/005; H01S 5/02284; H01S 5/02248; H01S 5/02415; G02B 6/4201
See application file for complete search history.

(56) References Cited

U.S. PATENT DOCUMENTS

| | | | |
|---|---|---|---|
| 2006/0093284 A1* | 5/2006 | Song | .................... H01S 5/02244 385/92 |
| 2014/0147085 A1* | 5/2014 | Lim | ..................... G02B 6/4249 385/89 |

FOREIGN PATENT DOCUMENTS

| | | |
|---|---|---|
| JP | H05-037062 A | 2/1993 |
| JP | H11-214556 A | 8/1999 |

* cited by examiner

*Primary Examiner* — Mohammed R Alam
(74) *Attorney, Agent, or Firm* — Baker Botts LLP; Michael A. Sartori

(57) ABSTRACT

An optical module that provides a feedthrough to carry an electrical signal output from and/or provided to a semiconductor optical device is disclosed. The feedthrough has a signal pad that carries the electrical signal thereon and at least two ground pads sandwiching the signal pad therebetween. The feedthrough further provides a cavity provided under the signal pad and spaces each between the signal pad and the ground pads.

8 Claims, 17 Drawing Sheets

OPTICAL MODULE IMPLEMENTING LASER DIODES

CROSS REFERENCE TO RELATED APPLICATION

The present application is based on and claims the benefit of priority of Japanese Patent Application No. 2017-155545, filed on Aug. 10, 2017, the entire content of which is incorporated herein by reference.

TECHNICAL FIELD

1. Field of Invention

The present application relates to an optical module that installs two or more semiconductor laser diodes.

2. Background Arts

A Japanese Patent Application laid open No. JP-H11-214556A has disclosed a feedthrough implemented in a semiconductor package that installs a semiconductor device for high frequency applications. The feedthrough disclosed therein, which transmits high frequency signals, provides interconnections on a dielectric substrate. The interconnections are disposed parallel to each other with spaces therebetween. The spaces provide respective grooves filled with air. Another Japanese Patent Application laid open No. JP-H05-037062A has disclosed a semiconductor laser (LD) module having a hermetically sealed package that encloses an LD therein.

One type of optical modules has been applied in the field of a high speed optical communication. Such an optical module is necessary to provide or extract a signal with high frequencies without degrading quality thereof. A condition of impedance matching is favorable to keep the signal quality. However, a transmission line and/or a signal pad, which carries the signal thereon and primarily influences the impedance matching, sometimes become hard to realize designed impedance. For instance, such a transmission line and/or a signal pad are configured with a micro-strip line accompanying a ground layer. In order to secure the designed impedance, the transmission line and/or the signal pad is necessary to have an enough width that is unacceptable from a viewpoint of making the optical module compact. One solution has been disclosed in a patent document listed above, where a module provides a groove between the signal pad and the ground pad. However, such a groove sometimes receives excess solder, which may shift parasitic capacitance between the signal pad and the ground pad from a designed one, or occasionally short-circuit the signal pad to the ground pad.

SUMMARY

An aspect of the present invention relates to an optical module that comprises a semiconductor optical device, a housing, and a feedthrough. The semiconductor optical device converts signals between an electrical form and an optical form. The housing encloses the semiconductor optical device therein. The feedthrough, which may be made of insulating material, is attached to the housing and has an interconnection, a signal pad, and at least two ground pads sandwiching the signal pad therebetween. The signal pad is connected with the interconnection. The electrical signal is carried on the interconnection between the signal pad and the semiconductor optical device. A feature of the optical module of the present invention is that the feedthrough further provides a cavity under the signal pad and also under spaces between the signal pad and the ground pads.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, some embodiments according to the present invention will be described referring to accompanying drawings. The present invention is not restricted to those embodiments but has a scope defined in claims attached hereto and all modifications and changes done within ranges equivalent thereto. Also, in explanations of the drawings, numerals or symbols same with or similar to each other will refer to elements same with or similar to each other without duplicating explanations.

Figure 1:
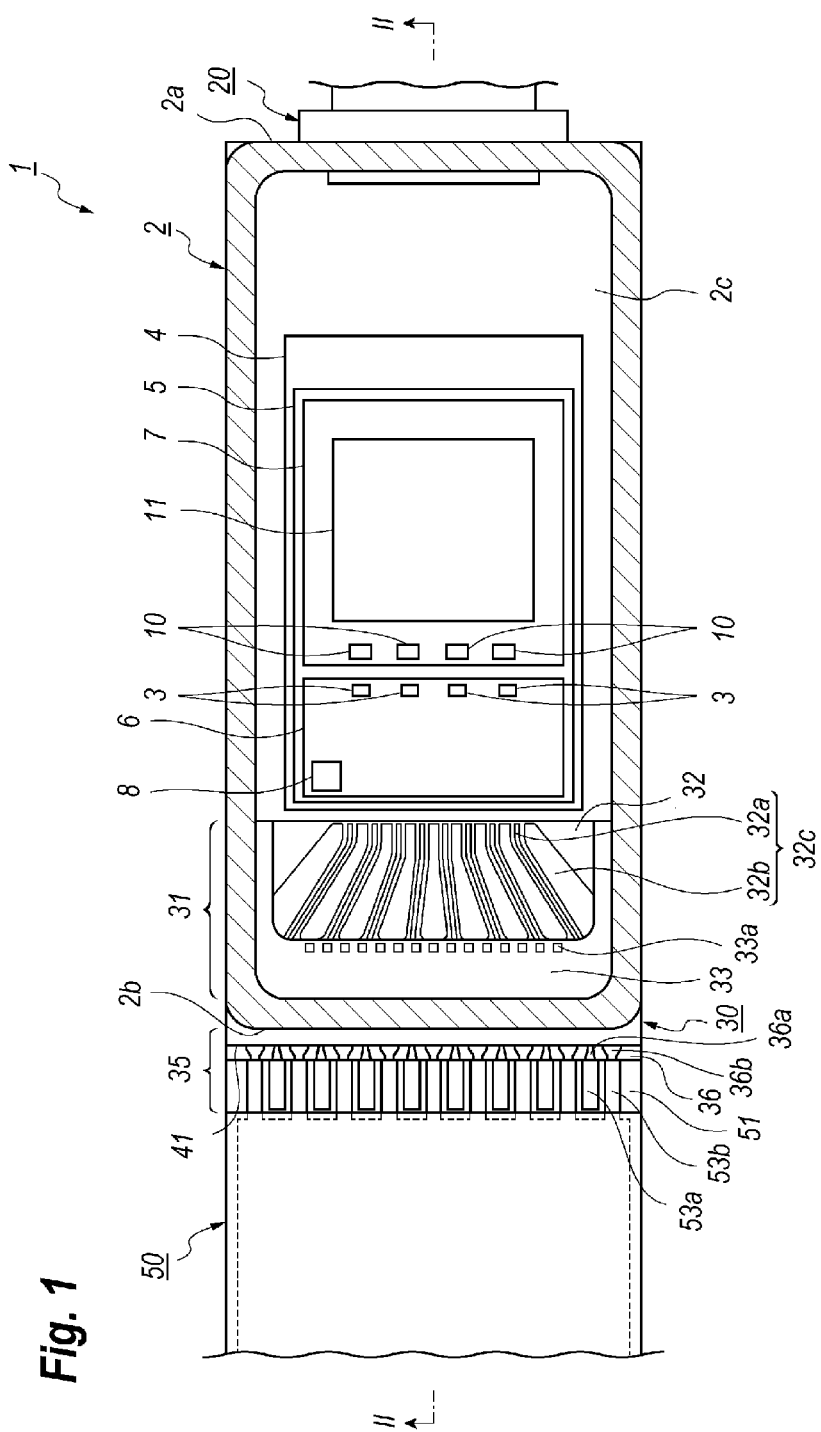
FIG. 1 is a top plan view showing an optical module according to an embodiment of the present invention.
Figure 2:
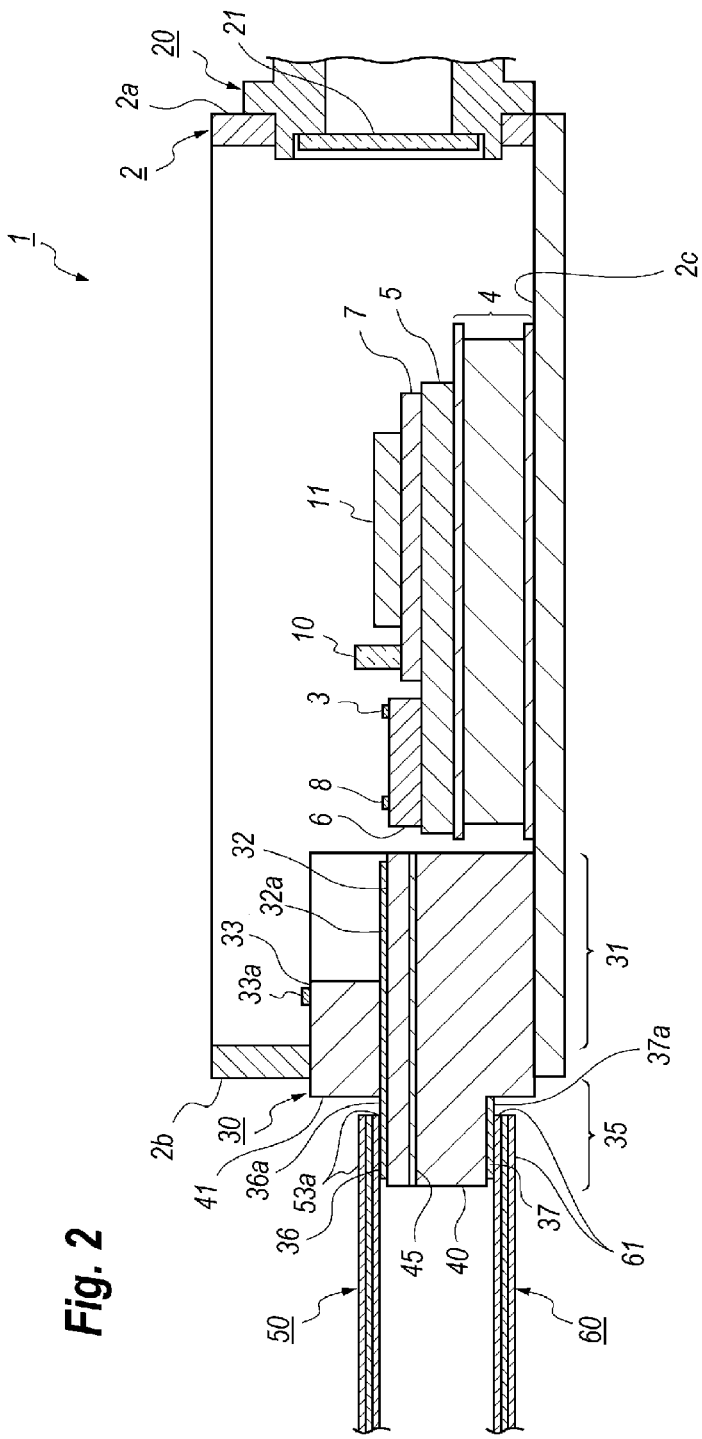
FIG. 2 shows a side cross section of the optical module taken along a line II-II indicated in FIG. 1.

FIG. 1 is a top plan view showing an optical module 1 according to an embodiment of the present invention; and FIG. 2 shows a side cross section of the optical module 1 taken along a line II-II indicated in FIG. 1. FIG. 1 and other figures showing the top view of the optical module 1 omit a lid in order to show an inside of the optical module 1. The optical module 1 includes a housing 2, an optical coupling unit 20, a feedthrough 30, a flexible printed circuit (FPC) board 50 for carrying high frequency signals, and another FPC board 60 for carrying DC or low frequency (LF) signals.

The housing 2 has a rectangular plane shape defined by two lateral sides, 2a and 2b, two longitudinal sides connecting the lateral sides, 2a and 2b, and a bottom 2c. Two lateral sides, 2a and 2b, and two longitudinal sides are built upward at respective edges of the bottom 2c. The housing 2 encloses at least one semiconductor laser diode (LD) 3 therein, where the present embodiment installs four (4) LDs 3 within the housing 2. The LDs 3 are laterally arranged with respective spaces substantially equal to each other. The LDs 3 may be modulated by signals supplied through the FPC board 50 and generates optical signals each having wavelengths specific thereto and different from each other. The wavelengths of the optical signals may be defined in, for instance, a multi-source agreement (MSA). Intensities of the respective optical signals output from the LDs 3 may be also defined in an MSA. Photodiodes, which are disposed within the housing 2 corresponding to the respective LDs 3 but not illustrated in the figures, may sense the intensities of the optical signals and output electrical signals through the FPC board 60.

The housing 2 also installs a thermo-electric cooler (TEC) 4, a base 5, two carriers, 6 and 7, a thermistor 8, lenses 10, and an optical multiplexer 11 therein. The TEC 4, which is mounted on the bottom 2c, may control a temperature of the LDs 3. Specifically, the TEC 4 is driven so as to maintain resistance of the thermistor 8 constant, where a thermistor 8 shows resistance strongly depending on a temperature thereof. Because the LDs 3 are mounted on the TEC 4, the control to keep the resistance of the thermistor 8 becomes equivalent to maintain temperatures of the LDs 3, which means that the LDs 3 may emit the optical signals with the defined wavelengths. The base 5, which may be made of material with good thermal conductivity, for instance, aluminum nitride (AlN), is mounted on the TEC 4. The LDs 3, the lenses 10, and the optical multiplexer 11 are mounted on the TEC 4 through the carriers, 6 and 7. The carrier 6 that mounts the LDs 3 may be also made of material with good thermal conductivity, for instance, aluminum nitride (AlN), while, the other carrier 7, which mounts the lenses 10 and the optical multiplexer 11 thereon, may be made of aluminum nitride (AlN) and/or aluminum oxide ($Al_2O_3$). Because the lenses 10 and the optical multiplexer 11 generate substantially no heat, the carrier 7 is unnecessary to be made of material with good thermal conductivity. The thermistor 8, as described above, senses a temperature of the carrier 6 around the LDs 3. The carrier 6 also provides interconnections connected with the LDs 3 via bonding wires to carry the modulation signals thereon that are provided through the FPC board 50.

The carrier 7, which is disposed between the carrier 6 and the side wall 2a, which will be called as a front wall. In the present specification, directions of "front", "forward", "back", and/or "rear" are merely used for the sake of an explanation and could not restrict a scope of the invention. The carrier 7 mounts four lenses 10 and a unique optical multiplexer 11. Each of the lenses 10, which is disposed corresponding to each of the LDs 3, optically couples with each of the LDs 3 to collimate, or substantially collimate the optical signals output from the LDs 3. Because the LDs 3 are not regarded as point optical sources, the optical signals output from the LDs 3 and passing the lenses 10 do not become true collimated beams but show respective beam waists. The optical signals passing the lenses 10 are multiplexed by the optical multiplexer 11 disposed between the lenses 10 and the optical coupling unit 20. An optical signal, which multiplexes four optical signals enters the optical coupling unit 20, is output from the optical multiplexer 11 to the optical coupling unit 20.

The optical coupling unit 20, which has a cylindrical shape, pierces the front wall 2a and provides a window 21 in a portion piercing the front wall 2a, namely, in a portion inside of the housing 2. The window 21 optically couples with the optical multiplexer 11. That is, the optical signal output from the optical multiplexer 11 enters the optical coupling unit 20 through the window 21. The optical coupling unit 20 further provides a portion outside of the housing 2, or outside of the front wall 2a, where another lens and an optical fiber each optically coupled with the window 21 are held. The optical signal passing the window 21 may be concentrated by this another lens onto the optical fiber.

The feedthrough 30, which is attached to another side wall 2b, which will be called as a rear wall, electrically connects components enclosed within the housing 2 with those prepared out of the housing 2. The feedthrough 30, which is mounted on the bottom 2c and pierces the rear wall 2b of the housing 2, may be made of multi-layered ceramics including aluminum oxide ($Al_2O_3$). The feedthrough 30 provides an inner portion 31 within the housing 2, an outer portion 35 outside of the rear wall 2b, and a ground layer 45 extending from the inner portion 31 to the outer portion 35.

The inner portion 31 provides a lower top surface 32 and a upper top surface 33. The lower top surface 32 provides transmission lines 32c that transfers the modulation signal provided from the FPC board 50 to the LDs 3. Each of the transmission lines 32c, which extends along the longitudinal direction of the housing 2, includes a signal line 32a and at least two ground lines 32b sandwiching the signal line 32a. The signal line 32a and the ground lines 32b are arranged along the lateral direction of the housing 2. The signal lines 32a are connected with the LDs 3. In the present embodiment, two transmission lines 32c arranged side by side with each other configure one differential line. That is, the present embodiment provides four differential lines 32c corresponding to the four LDs 3. The signal lines 32a and the ground lines 32b are connected with the interconnections provided on the carrier 6 through respective bonding wires. The upper top surface 33 in the inner portion 31 also includes interconnections 33a operable as bias lines and ground lines. The bias lines are connected with the thermistor 8 and the TEC 4 through respective bonding wires.

Figure 3:
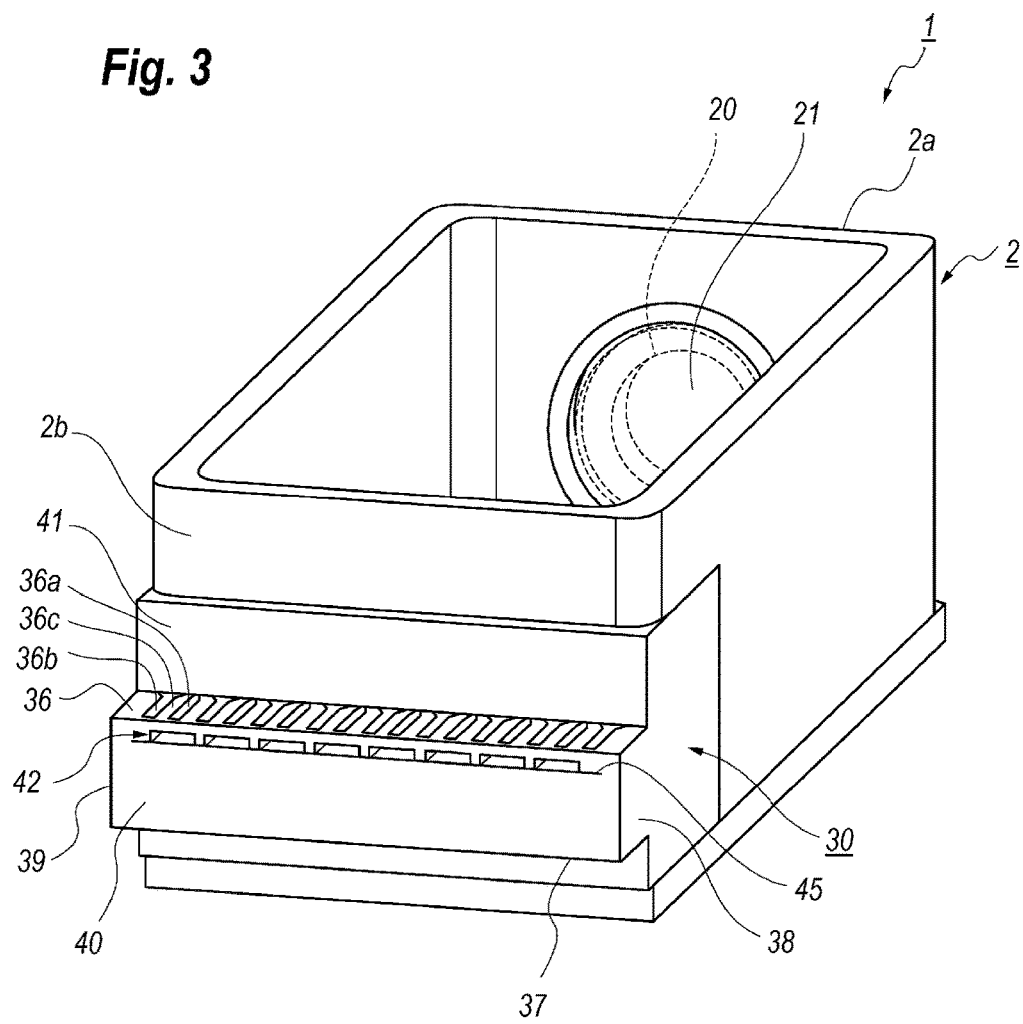
FIG. 3 is a perspective view of the optical module showing a rear thereof.

FIG. 3 is a perspective view of the optical module showing a rear thereof, in particular, the outer portion 35 thereof, where FIG. 3 omits the FPC boards, 50 and 60. The outer portion 35, as shown in FIG. 3, provides top surface 36 and a back surface 37 opposite to the top surface 36, two sides, 38 and 39, a lower rear surface 40, and an upper rear surface 41, where those surfaces, 36 to 40, configure a feedthrough base protruding from the housing 2.

The top surface 36, which protrudes from the rear wall 2b, includes at least one signal pad 36a, at least two ground pads 36b sandwiching the signal pad 36a, and at least two spaces 36c between the signal pad 36a and the respective ground pads 36b. The present embodiment provides eight signal pads 36a corresponding to four differential lines and nine grounds pads 36b where the signal and ground pads, 36a and 36b, are alternately arranged placing the spaces 36c therebetween along the lateral direction of the housing 2. The signal pads 36a are extended to the transmission lines 32c on the lower top surface 32 in the inner portion 31 and connected with the LDs 3 through the interconnections provided on the carrier 6 and the bonding wires. The grounds pads 36b, which defines the ground potential, are connected with the ground lines 32b. The back surface 37 provides other pads 37a including power supply pads and bias pads each of which is electrically connected with the bias lines 33a provided on the upper top surface 33 in the inner portion 31 through via holes. The ground layer 45, which is provided between the top surface 36 and back surface 37, extends substantially parallel to the top surface 36 and the back surface 37. The ground layer 45 is electrically connected with the ground pad 36b through via holes. The side surfaces, 38 and 39, include portions between the top surface 36 and the ground layer 45.

Figure 4:
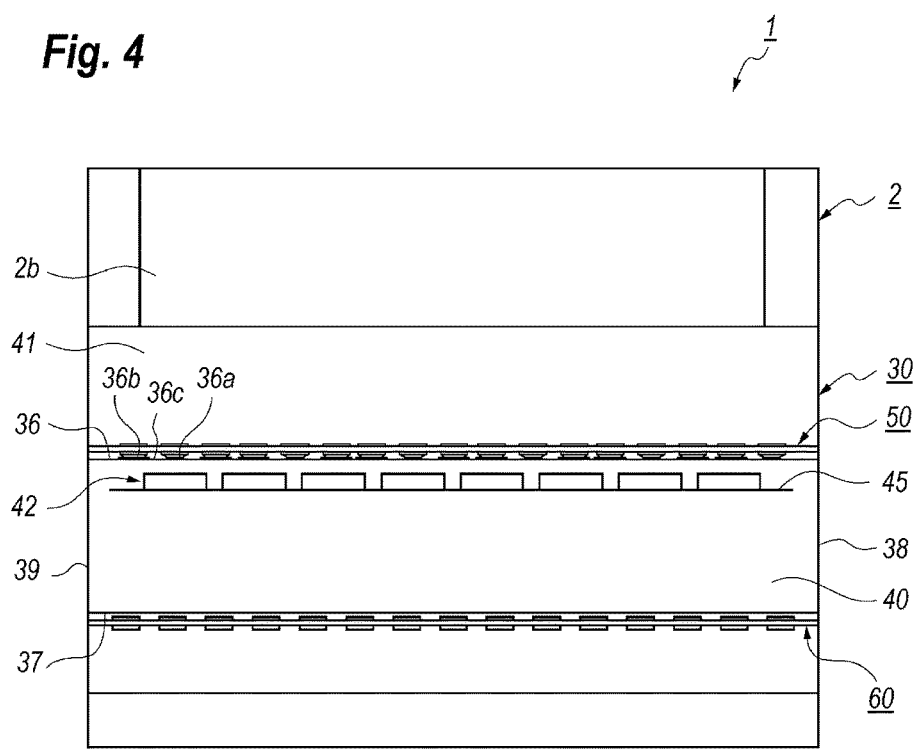
FIG. 4 is a rear plan view of the optical module.
Figure 5:
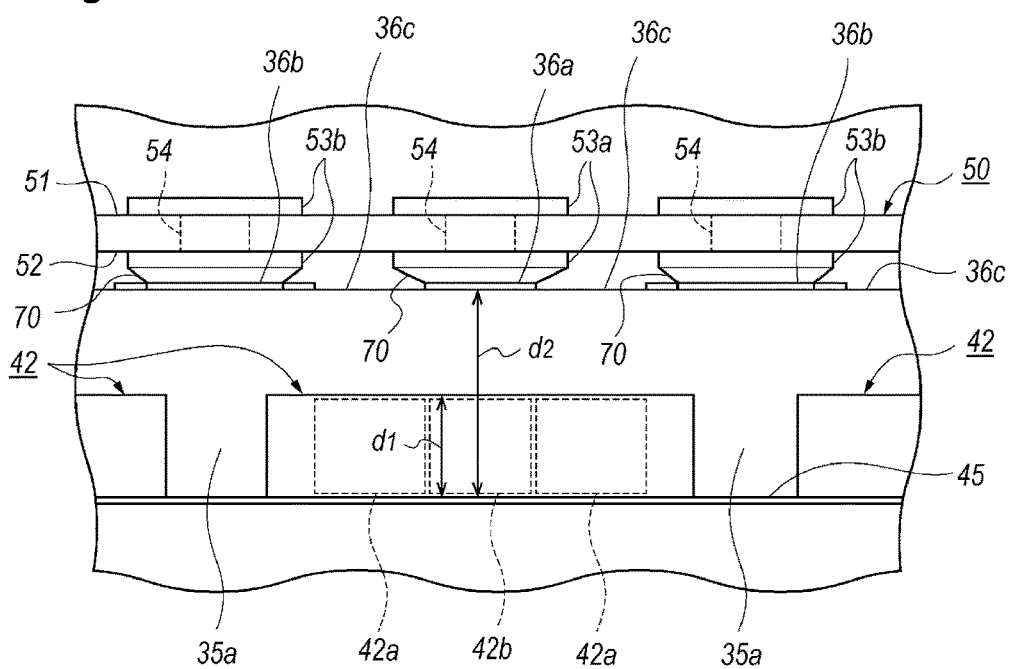
FIG. 5 magnifies a portion of a cavity shown in FIG. 4.
Figure 6:
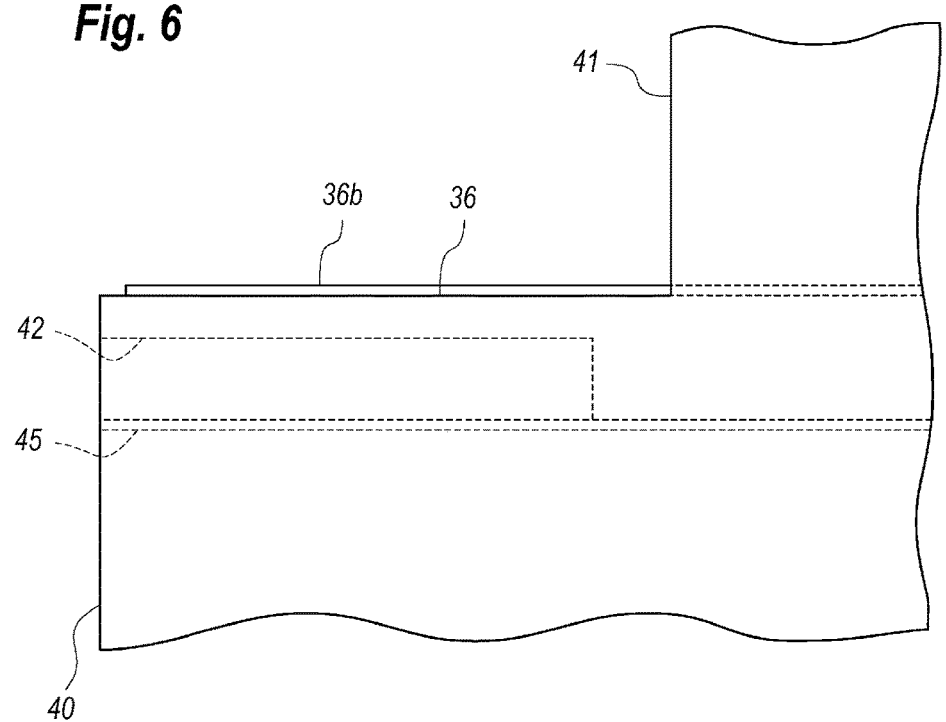
FIG. 6 is a side view of a feedthrough to which no flexible printed circuit (FPC) board is attached thereto.

The outer portion 35 further includes at least one cavity 42, where the embodiment shown in FIG. 3 includes eight cavities each corresponding to the signal pads 36a between the top surface 36 and the back surface 37. Each of the cavities 42 has a rectangular cross section with a longer side along the lateral direction of the housing 2. FIG. 4 is a rear plan view of the optical module; FIG. 5 magnifies a portion of a cavity shown in FIG. 4; and FIG. 6 is a side view of a feedthrough to which no flexible printed circuit (FPC) board is attached thereto, where FIG. 6 omits the FPC board 50. Referring to FIG. 5, each of the cavities 42 includes side portions 42a under the spaces 36c that sandwich signal pad 36a there and a center portion 42b overlapping with the signal pad 36a. In other words, the cavity 42 is provided between the signal pad 36a accompanying with the spaces 36c sandwiching the signal pad 36a and the ground layer 45 so as to expose the ground layer 45 therein. The cavity 42 has a height $d_1$ at least a half of a distance $d_2$ between the top surface 36 and the ground layer 45. In the present embodiment, the height $d_1$ of the cavity 42 is 0.1 to 0.3 mm, which corresponds to a thickness of one ceramic layer constituting the multi-layered ceramics of the feedthrough 30, while, a distance $d_2$ from the top surface 36 to the ground layer 45 is 0.2 to 0.6 mm, which corresponds to a thickness of two or more ceramic layers constituting the feedthrough 30.

The cavities 42 are arranged along the lateral direction of the housing 2 between the side surfaces, 38 and 39, as shown in FIG. 4 and FIG. 5. Provided between the cavities 42 are walls 35a that locate under the ground pads 36b. Widths of the cavities 42 and that of the walls 35a depend on pitches of the signal pads 36a, the ground pads 36b, and the spaces 36c between the pads, 36a and 36b. Specifically, the present embodiment sets a pitch between the signal pad 36a and the ground pad 36b to be 0.3 to 0.6 mm, and between the ground pads 36b to be 0.6 to 1.2 mm. On the other hand, a width of the walls 35a is restricted to a diameter of a via hole connecting the ground pad 36b with the ground layer 45. In an example, setting the diameter of a via hole to be 0.1 mm, the width of the walls 35a becomes 0.2 to 0.4 mm. Accordingly, the width of the cavity 42 is determined by a difference between the pitch of the ground pads 36b and the width of the wall 35a. Each of the cavities 42 extends from the lower rear surface 40 along the longitudinal direction of the housing 2 but not reaches to a position of the upper rear surface 41 as shown in FIG. 6. The embodiment provides the cavities 42 with a depth of 0.5 to 1.5 mm from the lower rear surface 40 when the upper rear surface 41 is apart from the lower rear surface 40 by 1 mm.

The FPC board 50, as shown in FIG. 5, provides a top surface 51, a back surface 52 opposite to the top surface 51, and signal pads 53a and ground pads 53b connected by respective via holes 54 each piercing from the top surface 51 to the back surface 52 and filled with metals. The signal pads 53a and the ground pads 53b are alternately arranged along the lateral direction of the housing 2. The signal pads 53a on the top surface 51 are connected with the signal pads 53a in the back surface 52 with via holes 54. Similarly, the ground pads 53b in the top surface 51 are connected with the ground pads 53b in the back surface 52 with via holes 54. The signal pads 53a and the ground pads 53b are respectively fixed to the signal pads 36a and the ground pads 36b on the top surface 36 of the outer part 35 of the feedthrough 30 with solder 70. The FPC boards, 50 and 60, may carry the modulation signals and the biases thereon, where the former is provided to the LDs 3 through the signal and ground pads, 35a and 35b, the differential lines on the lower top layer 32, the bonding wires, and finally to the interfaces provided on the carrier 6.

Figure 7:
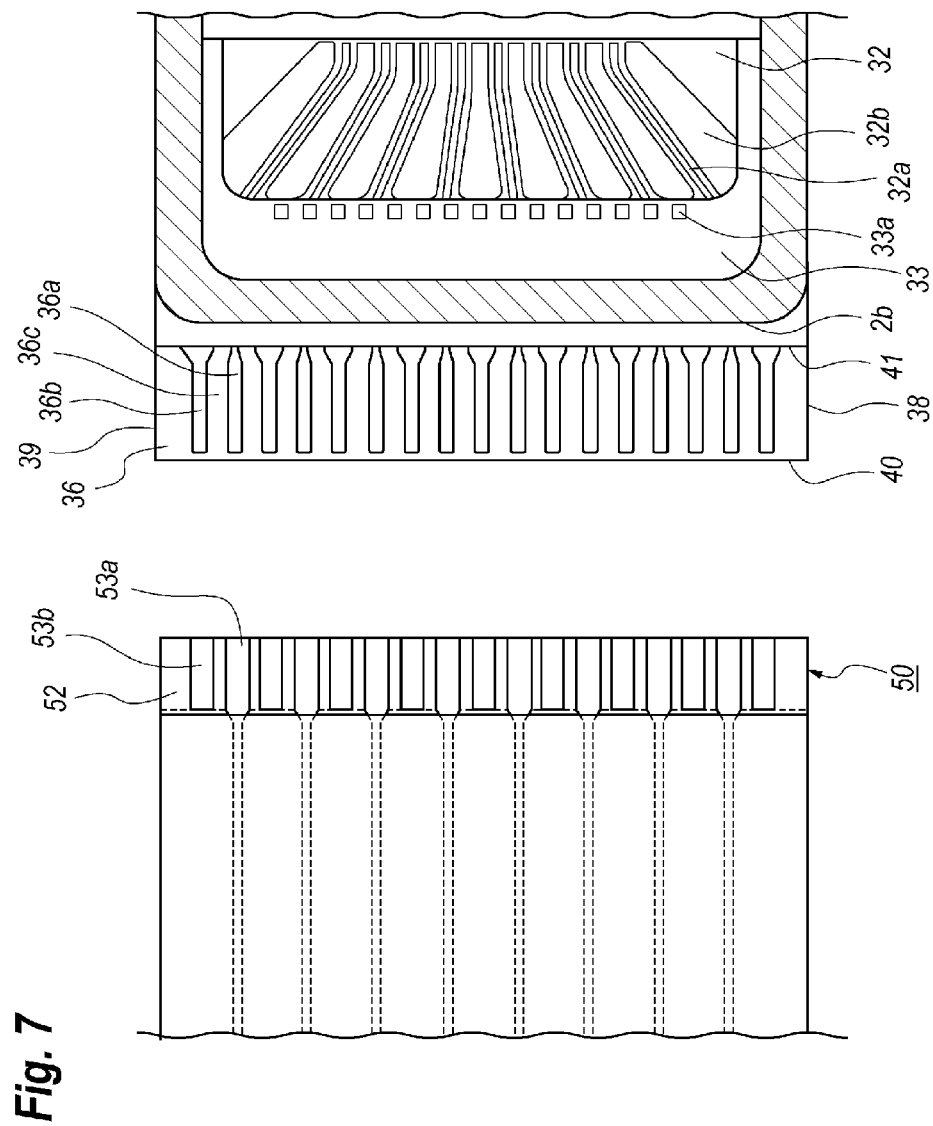
FIG. 7 is a plan view of the feedthrough and the FPC board before the FPC board is fixed to the feedthrough.
Figure 8:
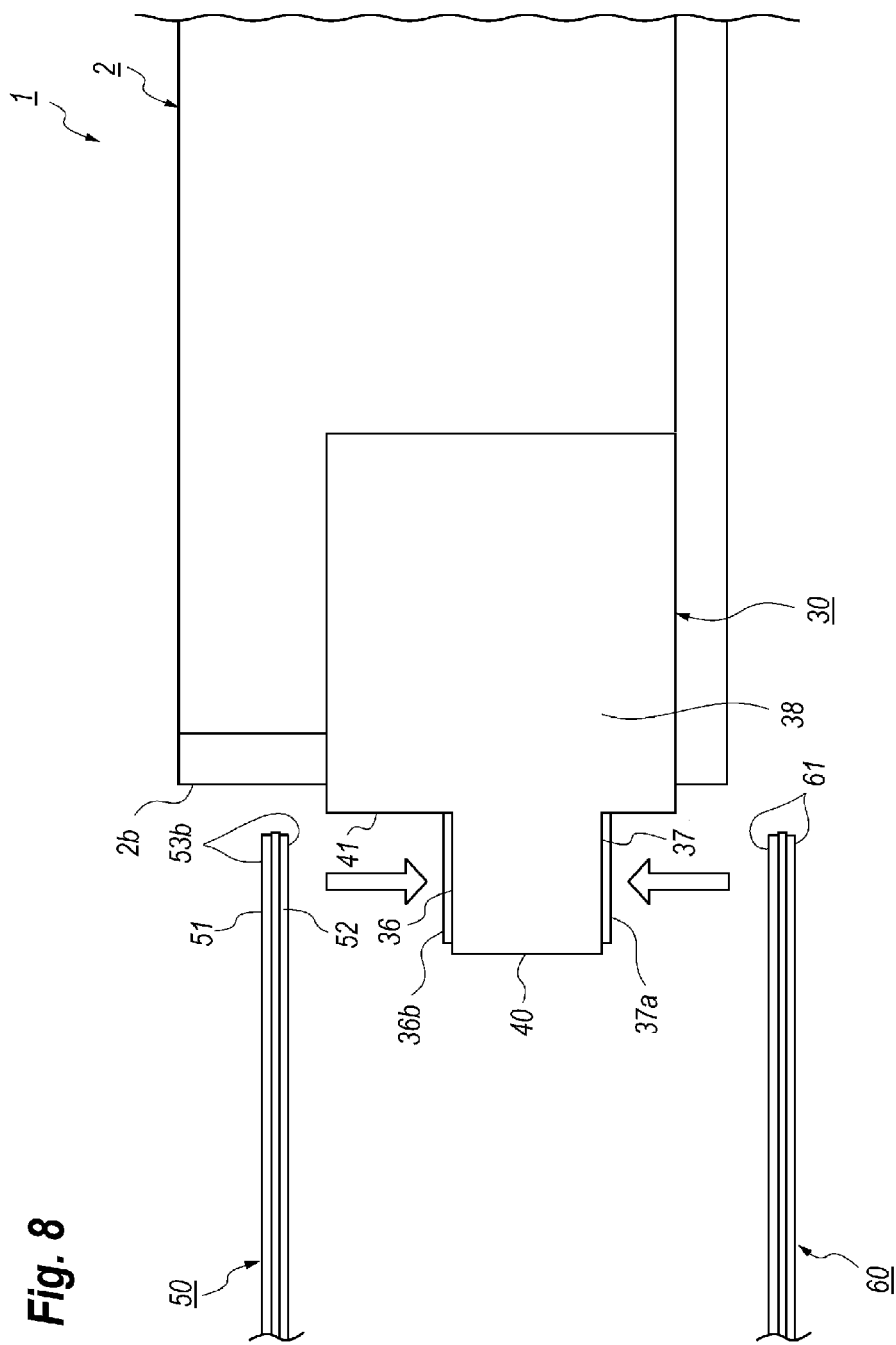
FIG. 8 is a side view showing a process of attaching the FPC boards to the feedthrough.

FIG. 7 is a plan view of the feedthrough and the FPC board 50 before it is fixed to the feedthrough 30; and FIG. 8 is a side view showing a process of attaching the FPC boards, 50 and 60, to the feedthrough 30. In FIG. 7, the FPC board 50 is shown the back surface top. The signal pads 53a and the ground pads 53b in the FPC board 50 are disposed corresponding to the signal pads 36a and the ground pads 36b in the top surface 36 of the feedthrough 30. When the FPC board 50 is soldered onto the top surface 36 of the feedthrough 30, the back surface 52 of the FPC board 50 faces the top surface 36 as attaching the signal pads 36a and the ground pads 36b in the top surface 36 to the signal pads 53a and the ground pads 53b in the FPC board 50 with solder 70 accompanying with flux. Also, the pads 61 in the other FPC board 60 are attached to the pads 37a in the back surface 37 of the feedthrough 30 using solder and the flux similar to the process for the FPC board 50. The pads 61 and the pads 37a include the bias pads and the ground pads. The FPC board 50 thus attached to the top surface 36 of the feedthrough 30 may supply the modulation signal to the LDs 3, while the FPC board 60 attached to the back surface 37 of the feedthrough 30 may supply bias currents to the LDs 3 and the TEC 4, and extract the signal from the thermistor 8 and the photodiodes.

Figure 9:
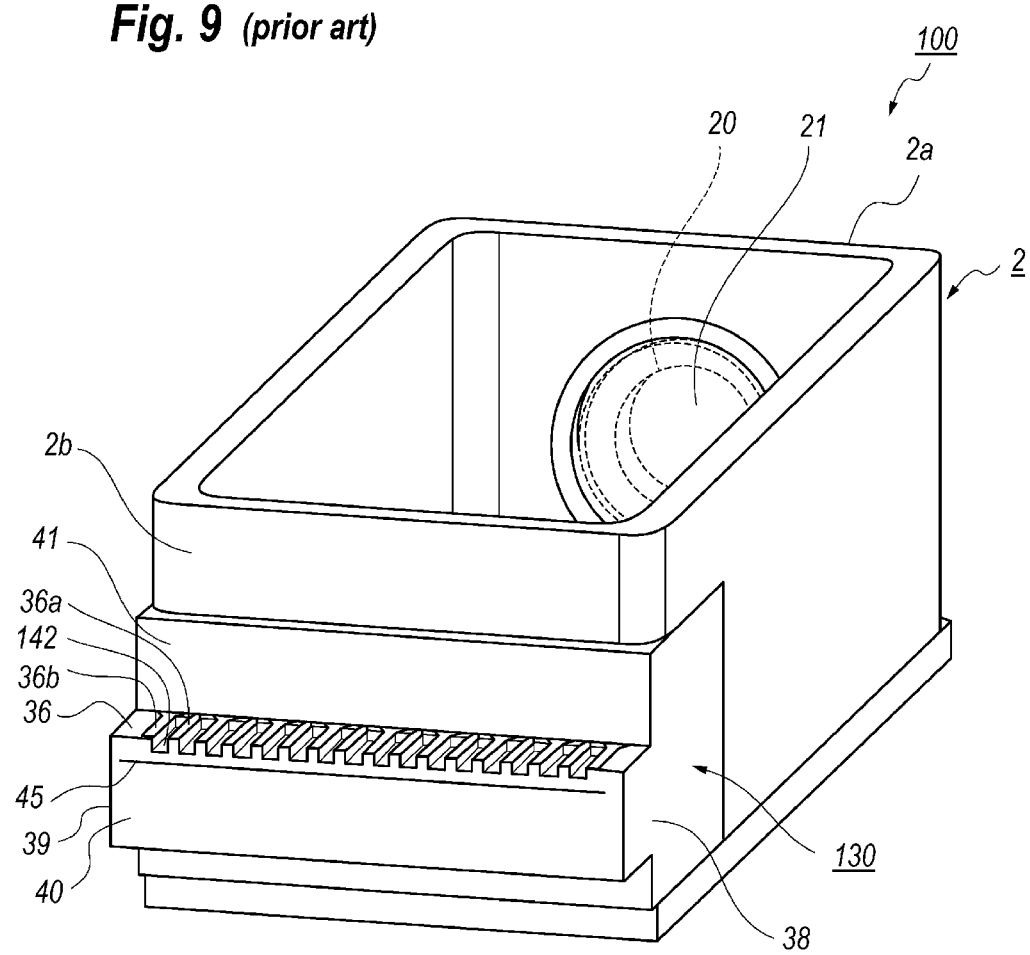
FIG. 9 is a perspective view showing a conventional arrangement of the feedthrough.

Next, advantages of the optical module 1 will be described comparing with an optical module 100 having a convention arrangement in a feedthrough. FIG. 9 is a perspective view of the optical module 100 having a conventional arrangement of the feedthrough 130. The optical module 100 provides, similar to the optical module 1 of the present embodiment, a housing 2, an optical coupling unit 20, and a feedthrough 130. The conventional feedthrough 130 has a shape distinguishable from that of the embodiment 30. The conventional feedthrough 130 provides a plurality of grooves 142 substituting the cavities 42. Each of the grooves 142, as shown in FIG. 9, are formed in the top surface 36 and disposed along the lateral direction of the housing 2.

Figure 10:
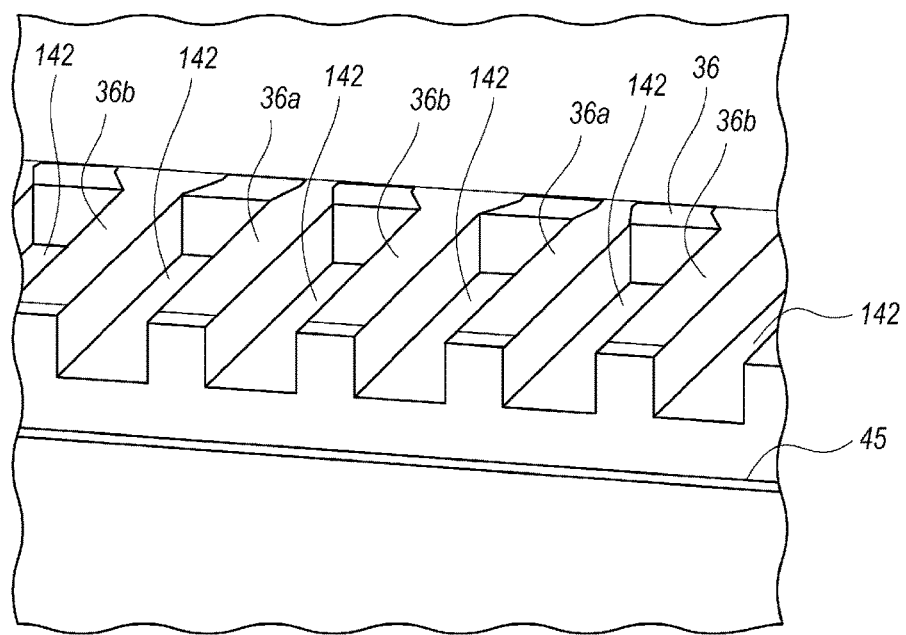
FIG. 10 magnifies a portion of the grooves in the feedthrough shown in FIG. 9.
Figure 11:
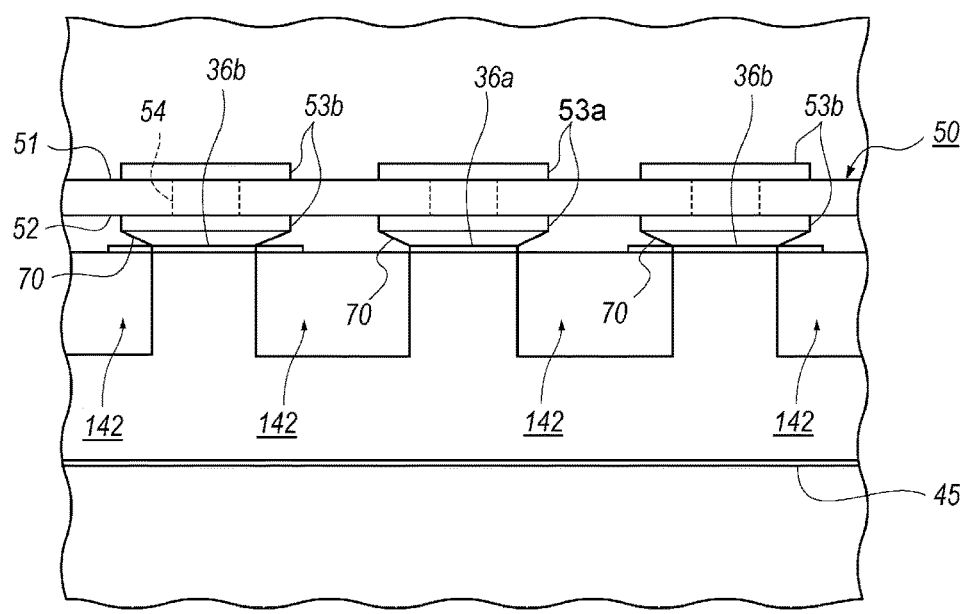
FIG. 11 is a rear view that magnifies the grooves shown in FIG 10.

FIG. 10 magnifies a portion of the grooves in the feedthrough shown in FIG. 9; and FIG. 11 is a rear view that magnifies the grooves shown in FIG. 10. Each of the grooves 142 is formed by digging the top surface 36 toward the ground layer 45 and disposed between the signal pad 36a and the ground pad 36b. Because the signal pad 36a provides gaps formed by the grooves 142 against the ground pads 36b and the gaps are filled with air inherently attributed to di-electric constant thereof smaller than that of ceramics, the signal pads 36a may reduce parasitic capacitance thereof formed against the ground pads 36b.

Figure 12A:
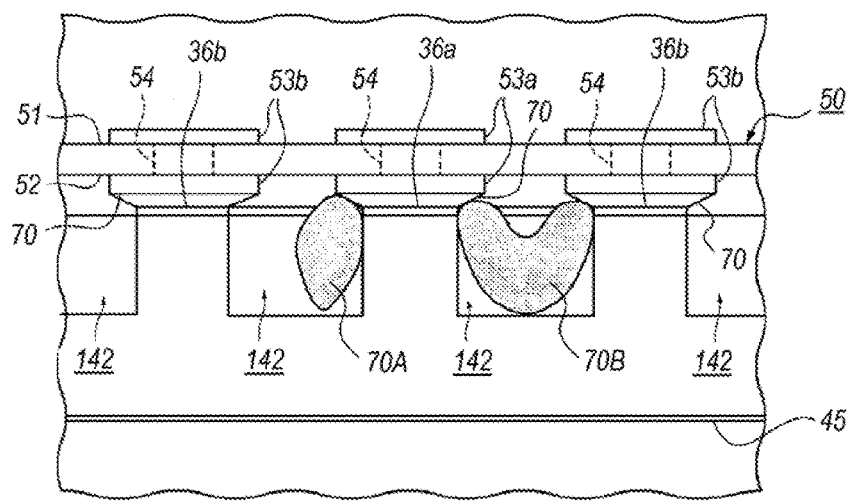
FIG. 12A and FIG. 12B explain subjects appearing in the conventional feedthrough shown in FIG. 9.
Figure 12B:
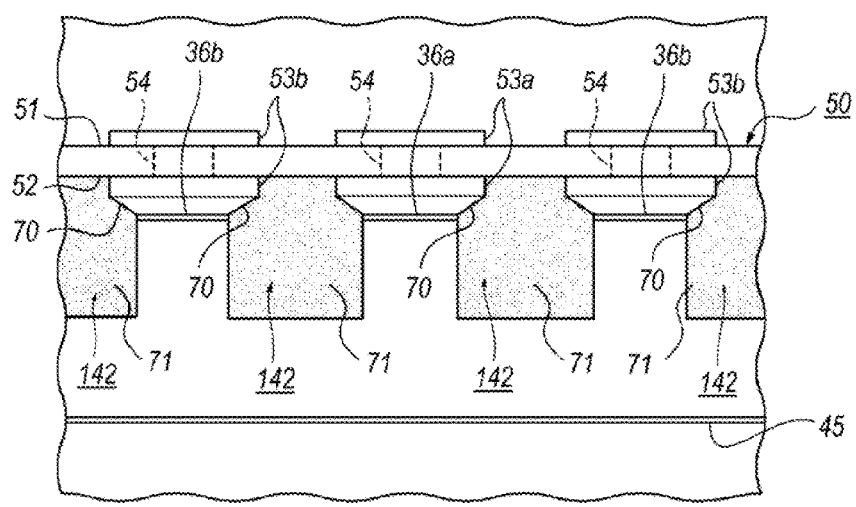

FIG. 12A and FIG. 12B explain subjects appearing in the conventional feedthrough shown in FIG. 9. FIG. 12A shows a status where excess solder 70A and 70B, which are used to attach the FPC board 50 to the top surface 36, falls within the grooves 142 arranged next to the signal pad 36a. The excess solder 70A equivalently shortens a physical length from the signal pad 36a to the ground layer 45, which possibly increases the parasitic capacitance of the signal pad 36a; while, the excess solder 70B fallen within the grooves 142 makes a short-circuit between the signal pad 36a and the ground pad 36b.

FIG. 12B shows a status where the grooves 142 are filled with flux 71 accompanying with solder 70. Because the flux 71 has di-electric constant greater than unity, namely, that of air, the parasitic capacitance between the signal pad 36a and the ground pad 36b possibly increases. Parasitic capacitance increased from a designed value may disarrange impedance conditions around the signal pads 36a and possibly degrades signal quality of the modulation signals provided to the LDs 3.

On the other hand, the feedthrough 30 of the present embodiment provides the cavities 42 between the top and back surfaces, 36 and 37, of the feedthrough 30 to suppress degradation of the transmission characteristic in the signal pads 36a. Each of the cavities 42 provides center portions 42b beneath the signal pads 36a, namely, between the signal pads 36a and the ground layer 45, and the cavities 42 are filled with air with di-electric constant thereof substantially unity, which is smaller than that of ceramic layers as described above. Accordingly, the feedthrough 30 of the present embodiment may reduce parasitic capacitance attributed to the signal pads 36a on the top surface 36. Moreover, the cavities 42 are provided between the top and back surfaces, 36 and 37, namely, not exposed to the top surface 36, which makes the cavities 42 free from excess solder and flux accompanying with the fixation of the FPC board 50 to the top surface 36 of the feedthrough 30. Accordingly, the feedthrough 30 of the present embodiment may maintain designed parasitic capacitance.

The cavities 42 may have the height $d_1$ that is a half or more of the distance $d_2$ between the signal pad 35a and the ground layer 45. This arrangement may securely reduce the parasitic capacitance attributed to the signal pad 36a.

First Modification

Figure 13:
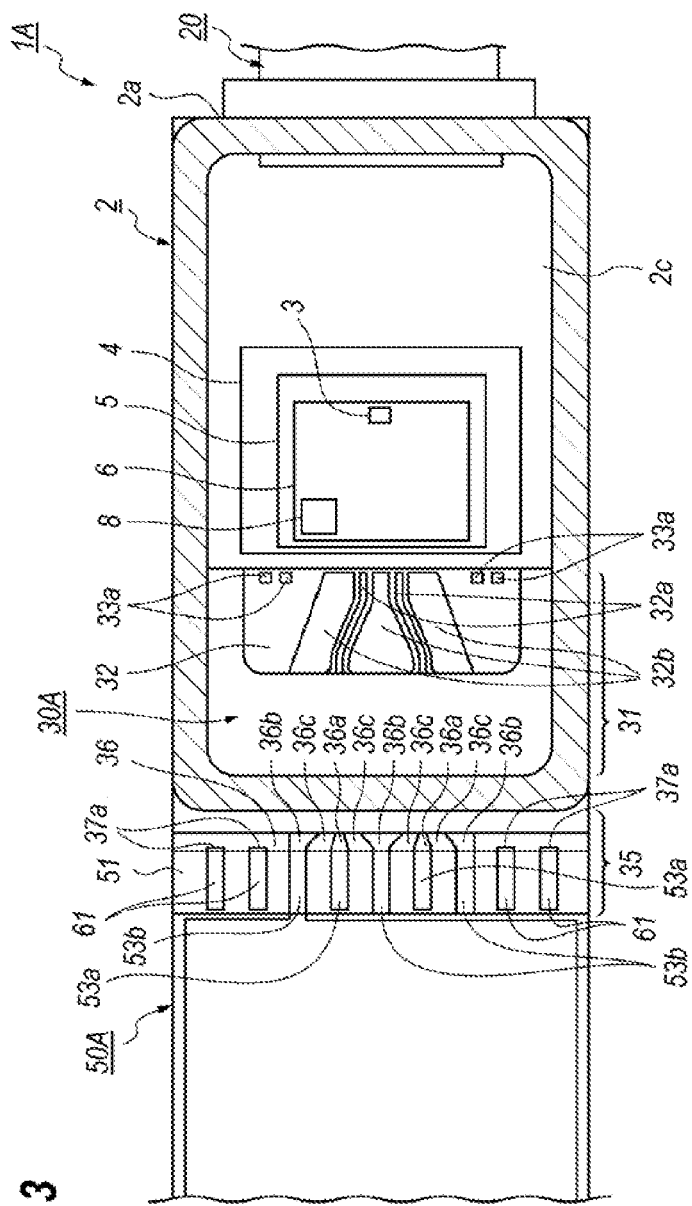
FIG. 13 is a top plan view showing a first modification of the optical module.

FIG. 13 is a top plan view showing a first modification of the optical module 1A. The modified optical module 1A has one feature distinguishable from the optical module 1, namely, the modified optical module 1A installs only one LD 3 within the housing 2. The modified optical module 1A removes the FPC board 60 in the optical module 1 that carries biases and extracts signals each having low frequency (LF) components; but provides modified FPC board 50A. The FPC board 50A includes signal pads, exactly, two signal pads 53a, ground pads 53b, and other pads 61, exactly four pads 61 for LF signals. Two signal pads 53a are surrounded by the ground pads 53b, while, the four pads for the LF signals surround the signal pads 53a and the ground pads 53b therebetween. The signal pads 53a may carry the modulation signal to the LD 3 through the signal pads 36a, the signal lines 32a, the interconnections on the carrier 6, and the bonding wires. The two signal pads 36a configure a differential line. The feedthrough 30A attaching the FPC board 50A thereto provides, similar to the feedthrough 30 of the previous embodiment, the cavities 42 in areas under the signal pads 36a and two spaces 36c between the signal pads 36a and the ground pads 36b.

Second Modification

Figure 14:
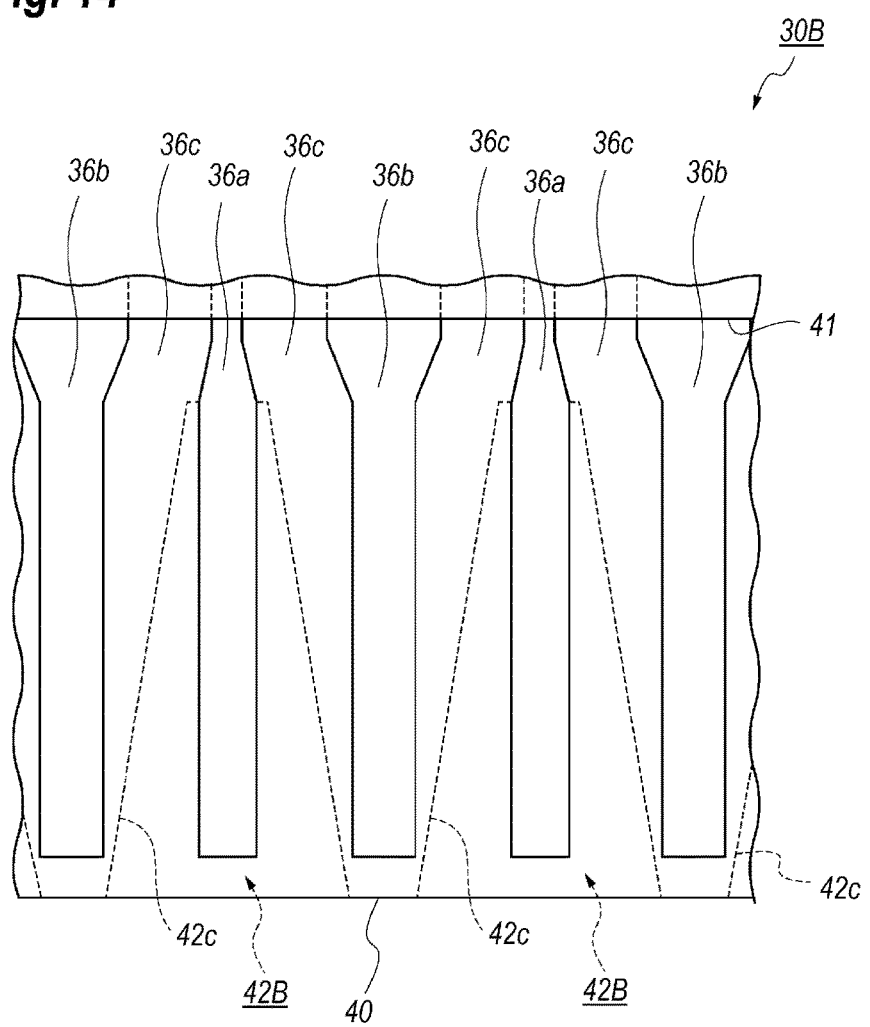
FIG. 14 is a top plan view that magnifies the feedthrough according to a second modification.

FIG. 14 is a top plan view that magnifies the feedthrough 30B according to a second modification. The feedthrough 30B has a feature distinguishable from the feedthrough 30 of the original embodiment that the cavities 42B provide tapered side walls 42c. That is, the cavities 42B narrows a width thereof as advancing toward the rear wall 2b of the housing 2. Because the ceramic layers may increase left portions as approaching the rear wall 2b of the housing 2, the feedthrough 30B may secure stiffness in the outer portion 35 closer to the rear wall 2b.

Third Modification

Figure 15:
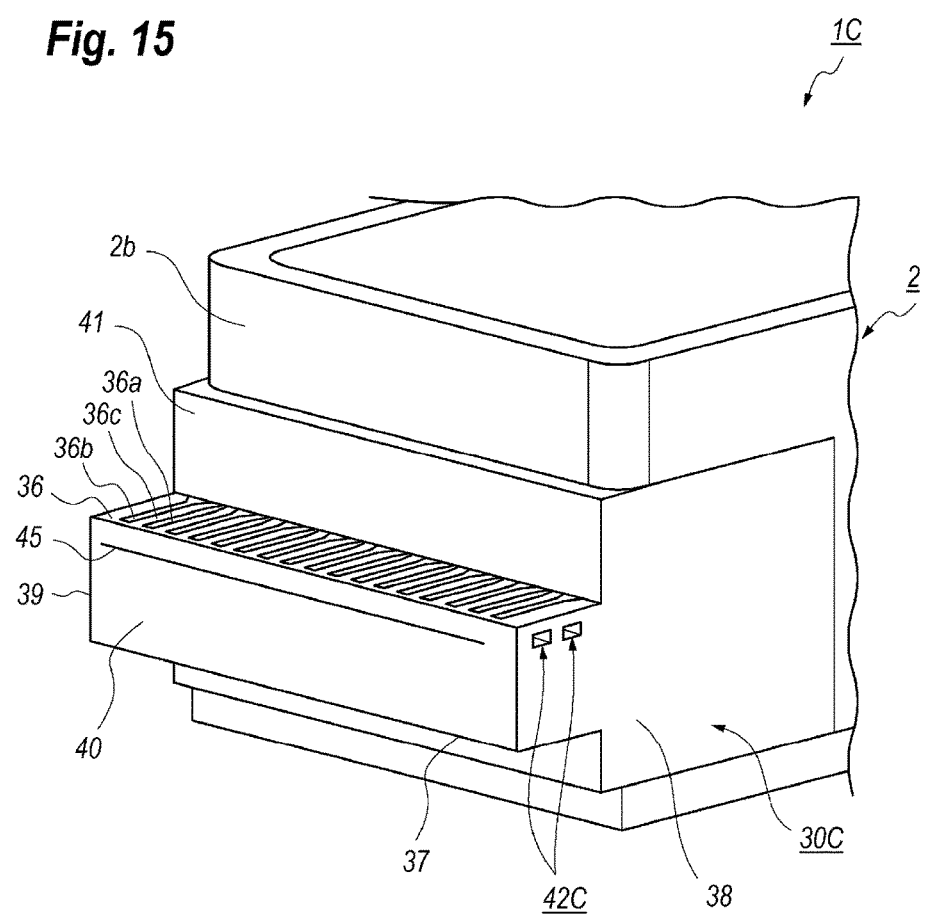
FIG. 15 is a perspective view showing a third modification of the feedthrough.
Figure 16:
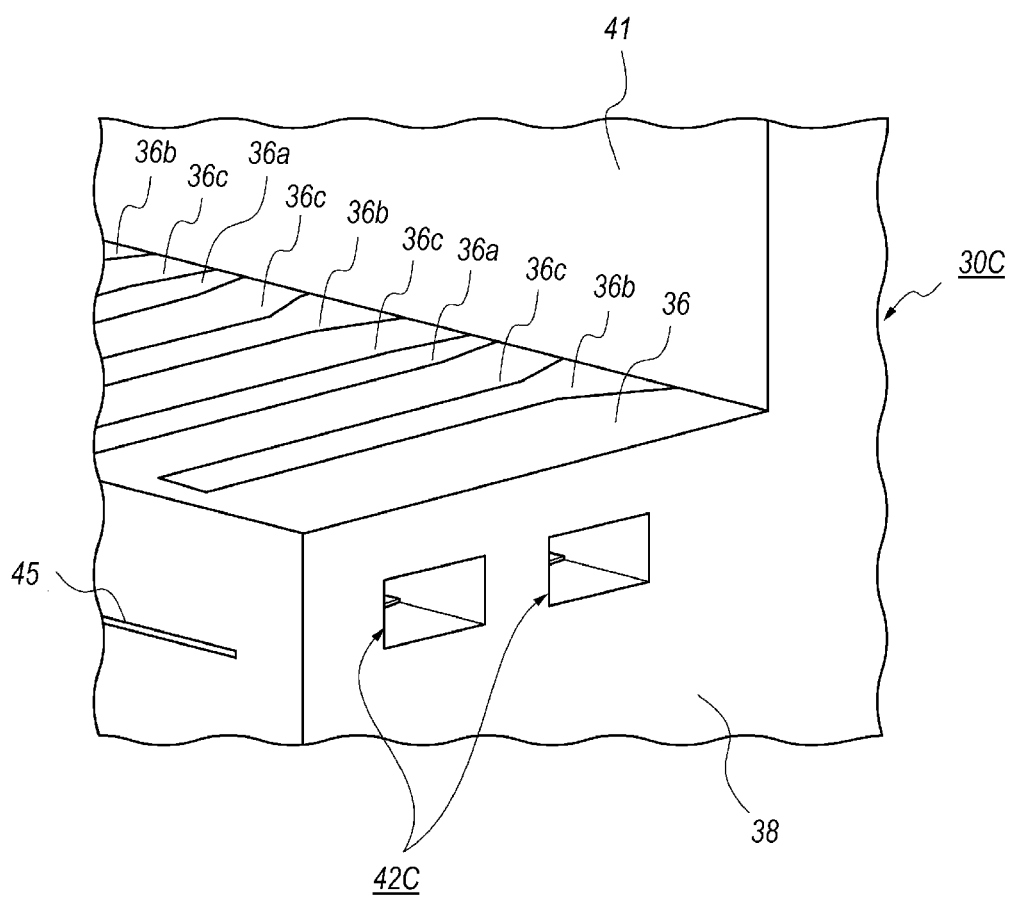
FIG. 16 magnifies cavities implemented in the third modification of the feedthrough shown in FIG. 15.
Figure 17:
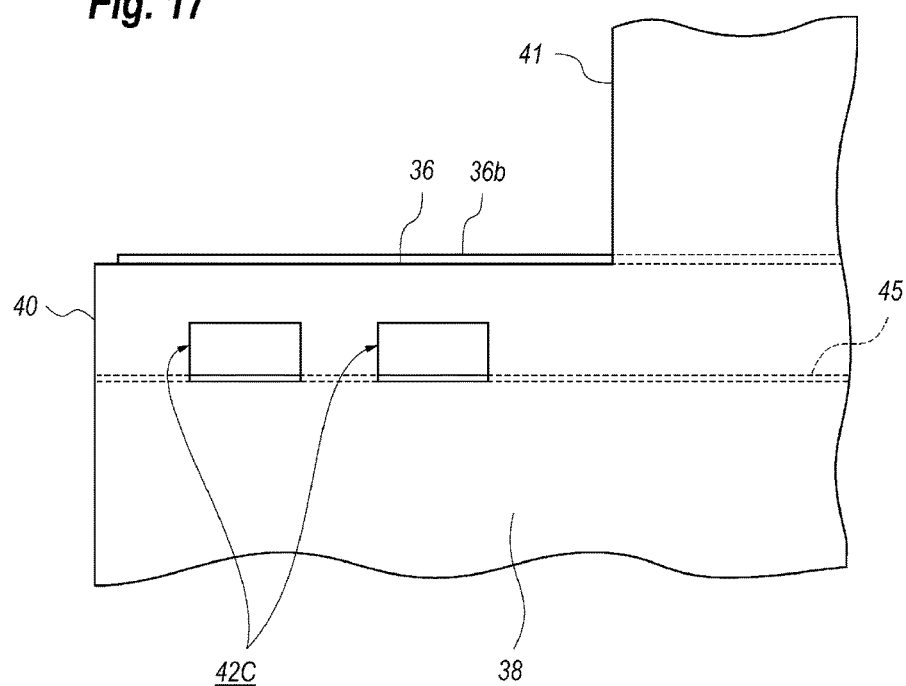
FIG. 17 is a magnified side view of the third modification of the feedthrough shown in FIG. 15.

FIG. 15 is a perspective view showing a third modification of the feedthrough 30C; FIG. 16 magnifies cavities 42C implemented in the third modification of the feedthrough 30C shown in FIG. 15; and FIG. 17 is a magnified side view of the third modification of the feedthrough 30C shown in FIG. 15. The feedthrough 30C of the third modification has a feature distinguishable from the original feedthrough 30, the feature being an arrangement of the cavities 42C. That is, the feedthrough 30C provides one or more cavities 42C that are disposed along the longitudinal direction of the housing 2 interposing walls therebetween from lower rear end 40 to the upper rear end 41. The cavities 42C of the present modification pierce from the side surface 38 to the other side surface 39. Each of the walls has a width between the cavities 42C of 0.2 to 0.4 mm, which enables to place vias connecting the ground pads 36b to the ground layer 45. The walls that extend so as to intersect the signal pads 36a and the ground pads 36b may operate as supporting posts for the top surface 36. When the FPC board 50 including the signal pads 53a and the ground pads 53b thereof is fixed to the signal pads 36a and the ground pads 36b in the top surface 36 using a solder 70 as pressing the FPC board 50 against the top surface 36, the walls may prevent the feedthrough 30C from being broken.

While particular embodiments of the present invention have been described herein for purposes of illustration, many modifications and changes will become apparent to those skilled in the art. For instance, the cavities, 42 to 42C, thus described have a rectangular cross section but the cavities in the cross sections thereof may have other shapes. Also, although the embodiments of the feedthroughs described above provide two or more cavities, a feedthrough may have only one cavity. Still also, the optical modules described above have an arrangement that an LD is driven in the differential mode, that is, two signal pads are provided for one LD; but an LD in the optical module may be driven by a single phase signal supplied with only one signal pad. Accordingly, the appended claims are intended to encompass all such modifications and changes as fall within the true spirit and scope of this invention.

What is claimed is:

1. An optical module comprising: a semiconductor optical device that converts signals between an electrical form and an optical form; a housing that encloses the semiconductor optical device; and a feedthrough made of insulating material and attached to the housing, the feedthrough having an interconnection, a signal pad connected with the interconnection, and at least two ground pads sandwiching the signal pad, the electrical signal being carried between the signal pad and the semiconductor optical device through the interconnection, wherein the feedthrough further includes a cavity under the signal pad and spaces between the signal pad and the ground pads, wherein the feedthrough further provides a ground layer provided under the cavity, the cavity exposing the ground layer.

2. The optical module according to claim 1, wherein the cavity has a height at least half of a distance between the ground layer and the signal pad.

3. The optical module according to claim 1, wherein the feedthrough further includes walls sandwiching the cavity and under the ground pads, the walls each having a via hole electrically connecting the ground pads with the ground layer.

4. The optical module according to claim 1,
further comprising a flexible printed circuit (FPC) board,
wherein the FPC board includes a signal pad and at least two ground pads, the signal pad in the FPC board being fixed to the signal pad in the feedthrough, the ground pads in the FPC board being fixed to the ground pads in the feedthrough.

5. The optical module according to claim 1,
wherein the feedthrough has a plurality of ceramic layers.

6. The optical module according to claim 1,
wherein the housing has a rectangular plane shape with a longitudinal side and a lateral side, the longitudinal side being determined by a front wall and a rear wall each extending along the lateral side, and
wherein the feedthrough is fixed to the rear wall of the housing and has a width along the lateral side substantially equal to a length along the lateral side of the housing.

7. The optical module according to claim 6,
wherein the cavity extends along the longitudinal side of the housing.

8. The optical module according to claim 6,
wherein the feedthrough has sides extending along the longitudinal side of the housing and determining the width of the feedthrough, and
wherein the cavity extends form one of the sides to another of the sides of the feedthrough along the lateral side of the housing.

* * * * *